United States Patent [19]
Soane

[11] Patent Number: 5,672,297
[45] Date of Patent: Sep. 30, 1997

[54] CONDUCTIVE COMPOSITE ARTICLES BASED ON EXPANDABLE AND CONTRACTIBLE PARTICULATE MATRICES

[75] Inventor: Zoya M. Soane, Piedmont, Calif.

[73] Assignee: The Dow Chemical Company, Midland, Mich.

[21] Appl. No.: 549,539

[22] Filed: Oct. 27, 1995

[51] Int. Cl.$^6$ .................. H01B 1/20; B32B 5/16
[52] U.S. Cl. .................. 252/511; 252/500; 252/510; 252/512; 252/513; 252/514; 252/515; 428/327; 428/355; 428/433; 428/434
[58] Field of Search .................. 252/511, 500, 252/510, 512, 513, 514, 515; 428/327, 355, 433, 434

[56] References Cited

U.S. PATENT DOCUMENTS

| | | | |
|---|---|---|---|
| 4,098,945 | 7/1978 | Oehmke et al. | 428/343 |
| 4,367,745 | 1/1983 | Welage | 428/327 |
| 4,952,293 | 8/1990 | Sypuls et al. | 206/180.7 |
| 5,094,769 | 3/1992 | Anderson, Jr. et al. | 252/71 |
| 5,328,756 | 7/1994 | Wright et al. | 428/220 |
| 5,330,874 | 7/1994 | Mahabadi et al. | 430/137 |
| 5,378,405 | 1/1995 | Gutman et al. | 428/355 |
| 5,484,681 | 1/1996 | Cunningham et al. | 430/137 |

*Primary Examiner*—Paul R. Michl
*Assistant Examiner*—Olga Asinovsky

[57] ABSTRACT

The present invention provides a gel-matrix whose electrical and/or thermal conductivity undergoes a significant change in response to minor variations in one of several externally controlled thermodynamic parameters, such as temperature, pH, ionic strength, and solvent composition. The matrix is formed by at least three primary components: conductive particles, swellable and deswellable crosslinked particles, and a solvent system. In the de-swollen state, the gel particles occupy a relatively small volume fraction of the gel-matrix, allowing the conductive particles to be discrete, fully suspended, and free flowing in the solvent system. Upon switching to the swollen state, the interstitial volume between the crosslinked gel particles diminishes, forcing the conductive particles to come into intimate contact with one another, thus creating a conductive percolation network. As a result, the electrical and/or thermal conductivity of the matrix is increased appreciably, because the interparticle connectivity among the conductive particles governs the electrical and/or thermal conductivity of the composite article. The conductivities exceed prior formulations with similar rheological characteristics, making such composite articles ideal for a number of specialized applications. Temperature-, pH-, ionic-strength-, and solvent-composition-sensitive switchable media are therefore prepared.

27 Claims, 3 Drawing Sheets

CONDUCTIVE COMPOSITE ARTICLES BASED ON EXPANDABLE AND CONTRACTIBLE PARTICULATE MATRICES

BACKGROUND OF THE INVENTION

1. Field of the Invention

This invention relates to conductive composite articles based on expandable and contractible particulate matrices which can be used as controllable transfer means of heat and electricity and high conductivity mediums and more particularly to new types of thermal and electrical switches.

2. Previous Art

Stable, concentrated solid-in-liquid dispersions find applications in a number of areas such as electronics, ceramics, paints and coatings. In the electronic packaging industries, for example, concentrated suspensions are used in substrate preparation, screen printing of circuits, and in thermal grease preparation. In order to enhance performance (for example, computer speed) and/or to miniaturize electronic devices, denser packaging of the components is essential. However, such dense packagings are realizable only when the large amount of heat generated is efficiently carried away from the active components.

Thermal grease or joint compounds are materials which play a pivotal role in minimizing the contact resistance between the heat source (integrated circuit chips or other hot regions) and heat sink. Of course, the use of thermal joint compounds is not restricted to computer and other electrical and electronic device applications. Thermal joint compounds are also useful in a number of areas where an effective thermal contact is sought, such as between a thermocouple probe and the heat source, and between two bolted metal parts having an air gap across which heat is transferred. For effectiveness the thermal compound should be highly thermally conducting, electrically insulating (if necessary), rheologically convenient (moderate yield stress, shear thinning, and in some cases thixotropic), easily applicable and removable, compliant and stable.

Low viscosity of thermal compounds is also required for use with fragile chips and solder bonds that attach the chips to a substrate. The force applied by the thermal grease to the chip must be minimal. However, contact of the thermal grease must be maximal to minimize interface thermal resistance for forming a good thermal path. While being compliant, thermal greases and joint compounds must be stable enough to withstand power cycling at high chip powers without degrading significantly, either in thermal conductivity or mechanically. Power cycling has mechanical stresses arising from the differences in coefficients of thermal expansion of the various material systems over the life of a module. There should be no phase separation between the liquid and solid components of the composite article.

The liquid carrier should also be somewhat viscous to slow down particle settling, but not too viscous as to be unmanageable. Thermal greases and joint compounds should have a reasonably high thermal conductivity and a high electrical resistivity such as silicone oil, mineral oil and motor oil.

Figure 1:
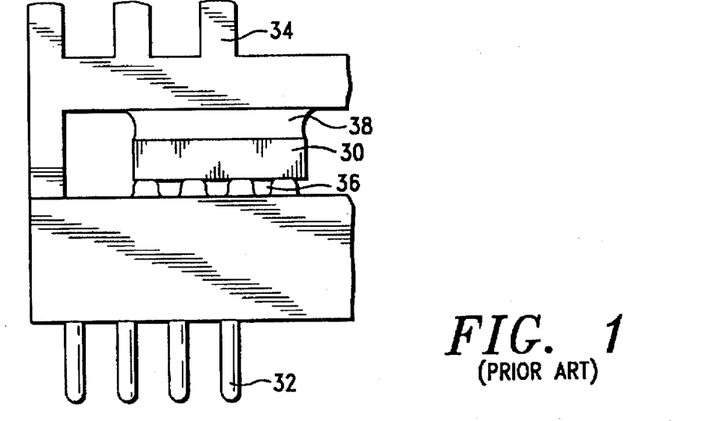
FIG. 1 shows a typical semiconductor package in which a thermal composite article of the present invention may be used.

Additionally, for effectiveness, the thermal composite articles should be capable of being applied in thin layers so that the total thermal resistance path through the thermal composite articles is as low as possible. FIG. 1 shows schematically how a thermal composite article is used between a chip and a thermal dissipation fin structure.

A thermal grease having a network structure or high loading may give rise to undesirable theological properties, such as a high yield stress and/or a greatly enhanced viscosity, shear thickening behavior, etc.

There are numerous thermal grease composite articles available in the art. U.S. Pat. No. 4,265,775 to Aakalu, et al., herein incorporated by reference, describes a thermal grease comprising a thermal filler powder of laminar or dendridic shapes. The filler particles are in a silicone liquid carrier. The liquid carrier contains silica fibers to help prevent bleeding of the filler particles from the liquid carrier. However, it has been found that at repeated power cycling and chip temperatures over 80° C., bleeding is not prevented by the addition of mere silica alone. Moreover, the invention described in the '775 thermal compound is not suitable for many applications because it cannot be removed completely by solvents. This causes metallurgical non-wetting problems during rework of solder joints, and contamination of other surfaces in multichip packages and the tooling (i.e. furnaces, etc.) used for assembling such packages.

Examples of a high thermal conductivity solid fillers dispersed in a liquid carrier that yield an electrically insulating suspension (if electrical insulation is desired) can be found in U.S. Pat. No. 3,885,984 (1975) by J. H. Wright, and European Patent number 0,114,000 (1986) by C. Lien and D. W. Whitehead, both incorporated herein by reference. The additional use of an electrically insulating solid filler ensures that the grease is electrically nonconducting. Here again, in order to prevent particle settling, high loadings and high viscosity suspensions must be used which gives rise to undesirable rheological properties.

Aside from thermal greases, stable, concentrated solid-in-liquid dispersions can be used as switching devices. Specially designed mechanical switching devices are known for making, carrying, and breaking electrical circuits under normal conditions as well as performing in a special way under abnormal conditions. These are common devices that protect a circuit against excess current flow or voltage surges, for example, a fuse.

Thermal fuses useful in electrical or electronic applications are known. U.S. Pat. No. 4,267,542 describes a device for a thermal fuse for use with an electrical apparatus in which easy access to the thermal fuse element (not specifically described) is allowed. U.S. Pat. No. 4,313,047 describes a fuse element which provides thermostatic control and thermal fuse overtemperature protection for an electrical heating device. U.S. Pat. No. 4,581,674 describes a thermal fuse element comprising an alloy having a eutectic composition at a predetermined threshold. Upon exposure to excessive heat, the alloy melts and the circuit opens. U.S. Pat. No. 4,757,423 relates to a fuse for an electronic component which incorporates a pad of a fusible material, preferably comprised of metal coated polymeric particles. Upon overheating, the metal melts and is dispersed within the polymer. None of the above mentioned fuses, however, are made of a gel composite for use in densely packaged components. Additionally, these are single use fuses.

Midwest Components, Inc., Product Data Sheet (1987) and Raychem Product Data Sheets (May 1988, November 1987, October 1989, June 1990, and April 1991) disclose PolySwitch ™ Products for reversible circuit breaking applications. The articles contain a homogeneous mixture of polyolefin and carbon and have an electrical resistance which increases with temperature or overcurrent. This basic approach relies on the melting and crystallization of semi-crystalline host polymer matrices. The general compounding, electron-beam crosslinking, and particle dispersion issues are severe. Additionally, switching kinetics tends to be slow.

Expanded polytetrafluoroethylene-containing articles are known to provide thermal insulation. Related U.S. Pat. Nos. 3,953,566, 3,962,153, 4,096,227, and 4,187,390, herein incorporated by reference, teach a porous product comprising expanded, amorphous locked fibrillated polytetrafluoroethylene (PTFE) which can be laminated and impregnated to provide shaped articles. The more highly expanded materials of that invention are disclosed to be useful, for example, as thermal insulators and shaped articles. However, once expanded, PTFE-containing articles cannot contract and are therefore not reversible. Therefore, this type of surge protector or overcurrent protector acts essentially as a typical one-use fuse.

U.S. Pat. No. 5,328,756, herein incorporated by reference, discloses a composite article comprising a PTFE matrix, electrically conductive particles, and energy expandable, electrically nonconductive hollow polymeric particles. The resulting composite is conductive and allows for the flow of electricity. Upon attaining a temperature which causes expansion of the expandable polymeric particles, the composite becomes insulating and causes the flow of electricity to cease. The articles are thin and can be used as electrical circuit breaking elements. However, once expanded, PTFE-containing articles cannot contract and are therefore not reversible. Additionally, PTFE-containing articles are not easily removed from a surface for re-work of a chip. Furthermore, when the particles are irreversibly expanded, the whole composite must expand. Composite expansion can be an undesirable feature because of potential damage to nearby intricate parts. In the expanded state, the conductivity is drastically and irreversibly reduced.

Conductive compositions comprising a polymeric binder system having electrically conductive particles and deformable non-conductive spherical domains have been disclosed, for example, in U.S. Pat. No. 4,098,945, herein incorporated by reference. Similar compositions have been disclosed to be useful as fuses in R. Woolnough, Electronic Engineering Times, Dec. 2, 1991, p 39. These systems share the same common deficiencies as the above-discussed inventions.

Aside from thermal greases and conductive switches, stable, concentrated solid-in-liquid dispersions can be used as conductive tapes. Conductive tapes are antistatic adhesive compositions useful for attaching surface-mount components at points on printed circuit boards where they are to be conductively attached e.g., by soldering. Antistatic adhesives, when coated on selected substrates and suitably converted, provide antistatic, pressure-sensitive adhesive tapes. The tapes are useful for masking printed circuit boards prior to wave soldering and the like.

A number of methods are known for preparing antistatic adhesive compositions. One common method is the addition of conductive moieties to conventional adhesive formulations. Antistatic species may be introduced as conductive materials such as electrically conductive metal or carbon particles. Compositions of this type are disclosed in EP 0276691A, EP 0518722A, U.S. Pat. No. 4,606,962, EP 0422919A, U.S. Pat. Nos. 3,104,985, 4,749,612 and 4,548, 862, each of which is herein incorporated by reference.

Ionic materials are also added to adhesive tapes to reduce generation of static charge. Suitable materials of this type include ion conducting species such as those disclosed in Japanese patents JP 61,272,279 and JP 63,012,681, herein incorporated by reference. These types are made from substrate materials whose conductivities cannot be actively controlled.

U.S. Pat. No. 4,098,945, herein incorporated by reference, discloses a conductive composition which comprises a polymeric binder system, a plurality of insoluble spherical domains dispersed in the system, and at least one electrically conductive filler dispersed in the binder which provides conductive pathways through the composition. The spherical domains are preferably adhesive microspheres, the use of which lessens the amount of conductive filler used. The spherical domains do not reversibly expand and contract. However, composite preparation is still hampered by the high viscosities of highly filled systems.

None of the above disclosed compounds can be easily removed from a surface for re-work. This is due to the fact that the viscosity of these compounds does not undergo a drastic, abrupt transition. The matrices doped with conductivity fillers in these disclosures do not themselves undergo "phase transitions." Additionally, the above disclosed compounds face the competing demands of increasing filler material for increased conductivity and decreasing filler material to keep the system viscosity as low as possible.

In view of the above there exists a need in the art for stable conductive composite articles having a high thermal conductivity and high electrical resistivity.

There is a need for these composite articles to also have relatively low viscosity for easy application and conformity to an object. Low viscosity is also needed for preventing the composite articles from exerting forces that crack chips or solder bonds which attach chips to substrates. However, composites are needed that can be stored indefinitely in the high viscosity state.

Additionally, there is a need for stable thermally conductive articles that do not experience phase separation between the liquid carrier and thermally conductive particles. Composites are also needed that will not degrade in viscosity or thermal conductivity during the reciprocating mechanical shear stress of power cycling of high powered VLSI and ULSI chips.

Additionally, there is a need for thermally conductive composite articles that are capable of being applied in thin layers so that the total thermal resistance paths through the thermally conductive composite articles are as low as possible.

There is also a need for conductive articles to be readily cleanable from chips and metal surfaces to facilitate rework of chips.

There is also a need to provide electrically conductive articles with high electrical conductivity.

There is also a need to provide electrically conductive articles that undergo controllable switching behavior.

SUMMARY OF THE INVENTION

The present invention substantially reduces or overcomes all of the above problems with the prior art. This invention comprises novel composites, whose viscosities and conductivity change dramatically. These changes are controllable and reversible, allowing easy deposition on and rework of surfaces and providing conductivity switches.

The invention provides a matrix formed by at least three primary components. The first two are swellable and deswellable crosslinked polymeric particles (also referred to as gel particles and gel beads) and a co-solvent system, together forming a gel-solvent matrix. The third component comprises conductive filler particles. Additionally, a suspending agent for the conductive filler particles may be added. Other materials may be added as desired, as discussed below.

The matrix undergoes a significant change in viscosity and and/or thermal conductivity in response to minor variations in one of several externally controlled thermodynamic parameters such as temperature, pH, ionic strength, and solvent composition. Under the controllable conditions, other variables, such as electrical field strength, photon, and pressure will also change the conductivity of the compound.

When the swellable and deswellable crosslinked polymeric particles are in a contracted state, the composite articles have relatively low viscosity for easy application and conformity to surfaces, as well as for wetting the surface to be cooled. Low stiffness also prevents the composite articles from exerting forces that crack chips or solder bonds which attach chips to substrates. The composite articles have low conductivity in this state.

When the swellable and deswellable crosslinked polymeric particles are in an expanded state, the composite articles become highly viscous. The polymeric particles absorb the solvent, causing the conductive filler particles to contact each other and form conductive pathways through the gel-solvent matrix. The total volume of the composite article does not change, therefore no damage is caused to nearby intricate parts. There is no degradation in viscosity or conductivity during the reciprocating mechanical shear stress of power cycling of high powered VLSI and ULSI chips while the gel particles are in the expanded state. There is no phase separation between the liquid carrier and conductive particles. The composites of this invention can be stored indefinitely at the high viscosity state.

Collapse of the swellable and deswellable crosslinked polymeric particles is triggered just before application to a surface thus providing a low viscosity state. Once in place, the particulates may be expanded causing the composite to "set," i.e., become highly viscous and conductive.

In a preferred embodiment, the article of this invention is placed between two conductive surfaces, such as metal plates, and serves as a reversible electrical circuit breaking element (fuse element) when an electrical current is provided, such as from a DC or AC power supply. Flow of current can be sustained over long periods of time without degradation in viscosity or conductivity. However, when too great a current or voltage is provided, resistive heating of the circuit breaking element occurs causing the swollen polymeric particles to contract, thus disrupting the connectivity of the conductive filler particles and breaking or opening the circuit.

Similarly, if the temperature of the environment containing the circuit breaking element increases and attains or surpasses the temperature at which the swollen polymeric particles of the composite article contracts, the circuit opens. Under controllable conditions, expansion of the swellable and deswellable polymeric particles leads to reversible closing and opening of the circuit.

The conductivity the composite articles is controlled by the state of the gel particles. In the de-swollen state, the gel particles occupy a relatively small volume fraction, allowing the conductive particles to be discrete, fully suspended, and free flowing in the solvent. Upon switching to the swollen state, the interstitial volume between the crosslinked gel particles diminishes, forcing the conductive particles to come into intimate contact with one another, thus creating a percolation network. This interparticle connectivity among the conductive particles governs the electrical and/or thermal conductivity of the composite article matrix. As a result of the gel particles being in the swollen state the electrical and/or thermal conductivity of the matrix is increased appreciably.

It is the existence of these pathways in a percolation network-type structure for a matrix when the gel particles are in an expanded state that elevates the system conductivity. When the gel particles are reversibly collapsed, these pathways disintegrate and the system conductivity diminishes as the percolation structure reverts back to a randomly dispersed conductive filler particle state. The composite articles of the present invention are then readily cleanable from chips and metal surfaces to facilitate rework of chips.

When electrically conductive particles are used, the mixtures can be formulated to undergo transitions that switch their electrical conductivity between that of an insulator and a conductor. Such switching behavior can be used for circuit surge protectors and self-regulating heating tapes, two of many practical examples of these mixtures.

When thermally conductive but electrically non-conductive particles are used, these systems can provide great heat dissipation properties, making them useful as thermal grease materials.

It is an object of this invention to provide an improved thermally conductive composite article.

It is an object of this invention to provide an improved electrical conductive composite article.

It is an object of this invention to provide a conductive switch for thermal, electrical, aqueous-based and non-aqueous-based systems.

In accordance with the above objects and those that will be mentioned and will become apparent below, the conductive composite article based on expandable and contractible gel particles, in accordance with this invention comprises:

nonconductive polymeric particles, said polymeric particles being controllably expandable and contractible;

a co-solvent for suspending said polymeric particles, said solvent forming a gel solvent matrix with said polymeric particles, some of said solvent being absorbed by said polymeric particles when said polymeric particles expand, said absorbed solvent being expelled from said polymeric particles when said polymeric particles contract; and conductive filler particles dispersed throughout said solvent, said conductive filler particles being too large to be absorbed by said polymeric particles.

In a preferred embodiment said conductive composite article further comprises a suspending agent for enhancing suspension stability of said conductive filler particles in said solvent.

In a preferred embodiment, said solvent is selected from the group consisting of small molecules, oligomers, soluble polymers, and mixtures thereof compatible with the desired viscosity level and gel particle chemistry.

In another preferred embodiment, when said polymeric particles expand, some of said solvent is absorbed into said polymeric particles, forcing said conductive filler particles into contact with each other, thereby forming a conductive network between and around said expanded polymeric particles whereby when said polymeric particles are expanded, said composite article is conducting, and when said polymeric particles are contracted, conductivity of Said composite article is reduced.

In another preferred embodiment, thermodynamic parameters cause said polymeric particles to expand and contract, wherein said thermodynamic parameters are selected from the group consisting of temperature, pH, ionic strength, solvent choice/composition, hydrophilic/hydrophobic and polar/nonpolar interactions between gel-bead polymer segments and between gel-bead polymer segments and solvent molecules of said composite article.

In another preferred embodiment, the composite article has a lower viscosity when said polymeric particles are contracted and a higher viscosity when said polymeric particles are expanded.

It is an advantage of the present invention that the conductive filler particles and the swellable and deswellable polymeric particles do not easily disassociate from the gel-solvent matrix when the gel-solvent matrix is stored, handled, or in use during the intended applications.

A further advantage of the composite articles is that the total volume fraction loading of the solids content increases as the swellable and deswellable polymeric particles expand, thereby increasing the viscosity of the matrix enhancing composite stability. Furthermore, the total volume of the composite article does not change, therefore no damage is caused to nearby intricate parts.

A further advantage of the composite articles compounds is that they are easily and completely removed from a surface for rework.

BRIEF DESCRIPTION OF THE DRAWING

For a further understanding of the objects and advantages of the present invention, reference should be made to the following detailed description, taken in conjunction with the accompanying drawing, in which like parts are given like reference numerals and wherein:

FIG. 2 illustrates the volumetric response of the gel particles of the prior art.

FIG. 3 shows three response curves.

FIG. 4 shows how the expansion and contraction process reversibly forms and destroys the percolation network set up by the conductive filler particles.

DETAILED DESCRIPTION OF THE INVENTION

The invention provides a matrix formed by at least three primary components. The first two are swellable and deswellable crosslinked polymeric particles and a solvent system, together forming a gel-solvent matrix. The third component comprises conductive filler particles. Additionally, a suspending agent for the conductive filler particles may be added. Other materials may be added as desired, as discussed below.

In a preferred embodiment, this invention provides gel-like composite articles, or greases, which can be used as thermal or electrical fuse elements, or high conductivity mediums (i.e., thermal or electrical pastes). Electrical current or heat can flow through the composite article with little internal resistance.

Figure 2A:
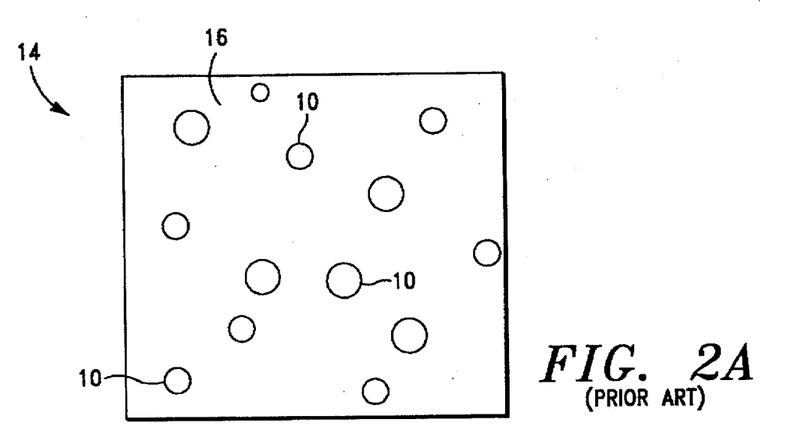
FIG. 2A shows contracted gel particles in bead form.
Figure 2B:
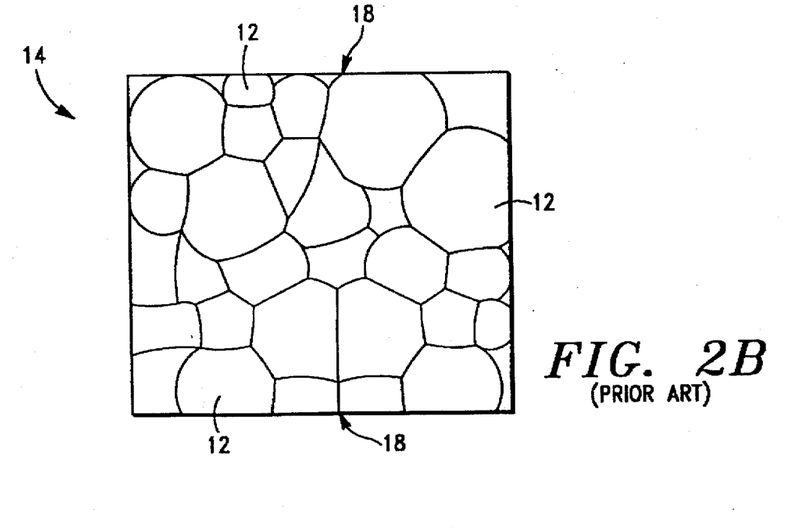
FIG. 2B shows expanded gel particles compressing together and assuming a polygonal geometry.

FIG. 2 illustrates two phases of the first two components of the invention. Certain variations of thermodynamic parameters induce distinct volume transitions in expandable polymeric particles. These are indicated in FIG. 2A by the numeral 10 when the polymeric particles are contracted, and in FIG. 2B by the numeral 12 when the polymeric particles are expanded within a gel-solvent matrix, shown generally by the arrow 14. Thermodynamic parameters include, but are not limited to, temperature, pH, ionic strength, solvent choice/composition, and hydrophilic/hydrophobic and polar/nonpolar interactions between the swellable and deswellable polymer particles 10 forming the crosslinked network of the gel compound 14 and the surrounding solvent 16 molecules. Under controllable conditions, other variables, such as electrical field strength, photon, and pressure will also change the conductivity of the compound. It is this relative interplay that forms the underlying principle causing the observed gel particle 10 response of swelling and deswelling.

In the contracted state, FIG. 2A, the gel particles 10 are in a bead form (they are generally polymerized as spheres). When the gel particles 10 are contracted, the gel-system 14 is a viscous fluid and the gel particles 10 readily flow in the solvent 16. The viscosity behavior is a thoroughly studied subject. Both experimental and theoretical treatises exist in general rheology literature, especially suspension rheology. See for example, L. E. Nielson, 2 MECHANICAL PROPERTIES OF POLYMERS AND COMPOSITES ch. 7 (Marcel Dekker 1974). Such systems are often non-Newtonian and time dependent. In FIG. 2B, when the gel particles 12 are expanded, they compress into one another and assume a polygonal geometry.

The first discovery of swellable and deswellable gel particles was made in the early 1980s. A detailed description can be found in *Responsible Gels*, 109 and 110 ADVANCES IN POLYMER SCIENCE (K. Dusek ed. Springer Verlag 1993); and A. Sassi, POLYMER APPLICATIONS FOR BIOTECHNOLOGY, (D. Soane ed. Prentice Hall 1992). The system was an N-substituted polyacrylamide known as NIPA (N-isopropylacrylamide). In an aqueous environment, slabs of NIPA exhibited a discontinuous volume transition when temperature was reversibly scanned up and down past a critical point.

This discovery has led to a great number of formulations based on substituted polyacrylamides as either homopolymers or copolymers. These acrylamide derived systems also undergo distinct transitions when the aqueous solvent is doped with other water-miscible organic solvents such as alcohol or acetone. Additionally, copolymers with acrylate and methacrylate salts can be easily switched by pH or ionic strength changes. Design guidance for responsive gel beads 10 useful for aqueous-based, buffered solvents 16 are well known in the art and can be found in *Responsible Gels*, 109 and 110 ADVANCES IN POLYMER SCIENCE (K. Dusek ed. Springer Verlag 1993).

Gel particles 10 can be readily produced by a number of standard techniques which are well known in the art, for example, radiation-induced polymerization or thermally-promoted polymerization. A general discussion can be found in F. Rodriguez, PRINCIPLES OF POLYMER SYSTEMS, McGraw Hill, 1970.

The chemistry may be free-radical, ionic, step (condensation) or chain polymerization. Suspension, emulsion, inverse emulsion, and precipitation polymerization reaction engineering are all well documented in the polymer literature. Surfactant usage and mechanical agitation can influence the average gel particle 10 size and distribution. Catalysts and initiators (photo or thermal) are again well known to those skilled in the art of polymerization reaction engineering. Ultrasonic energy, stirrers, paddies, and other mixing techniques also contribute to the success of gel particle 10 preparation. An important aspect of polymerization is the chemical formulation of the gel beads 10. This process is well known in the art. A general overview can be found in 4 and 13 ENCYCLOPEDIA OF POLYMER SCIENCE AND ENGINEERING (M. Bikales, Overberger, Menges eds. Wiley 1988).

In the present invention, each gel bead 10 should contain the necessary part of the following combination of ingredients: monomers (one or more than one kind), oligomers, crosslinkers (one or more than one kind), initiator or catalyst, and other additives (such as stabilizers or accelerators. For those skilled in the art of polymer science and engineering, the above ingredients and their respective roles in polymerization reactions are well known. An infinite number of formulations may be developed, each designed for solvents selected, operative over a desired temperature range. Instead of enumerating this infinite list, a few examples are cited below to illustrate basic strategies for general gel bead 10 development.

Methods for developing formulations of gel beads 10 useful in aqueous mixtures are well known in the art. Any of a large array of monomers/oligomers that lead to water-compatible polymers upon polymerization may be used. Examples include substituted acrylates and methacrylates, vinyls, acrylamides, cellulosics and derivatives, oxides, amides, and ionizable monomers. A partial list is given in D. Soane, POLYMER APPLICATIONS FOR BIOTECHNOLOGY (Prentice Hall 1992). Another source is POLYMER HANDBOOK (J. Brandrup and E. H. Immergut eds. Wiley 1975). The gel beads 10 produced are judiciously crosslinked by adding to the starting mixture a measured quantity of crosslinkers to ensure expansion and contraction reversibility.

Contracted polymeric particles 10 are desirably in the size range of from about 0.05 micrometer to about 1000 micrometers, preferably from 0.05 micrometer to 200 micrometers, most preferably from 0.05 micrometer to 100 micrometers.

As stated earlier, controllable variations in temperature, pH, ionic strength, and solvent 16 choice/composition may trigger change in preference between gel-bead segment—segment interaction (forming the crosslinked network of the gel particles 10) and gel-bead segment-solvent interaction. If segment—segment attraction is stronger than segment-solvent attraction, the network collapses, and the gel bead 10 volume is depressed. When the thermodynamic variables are tuned to those causing stronger segment-solvent attraction than segment—segment attraction, the gel beads 12 expand and can occupy a total volume an order of magnitude greater than the same gel beads 10 in the collapsed state.

Expanded polymeric particles 12 can have a size in the range of from about 0.2 micrometer to 1000 micrometers, preferably from 0.4 micrometer to 200 micrometers. After expansion, the volume of the expandable polymeric particles 12 increases by a factor of at least 1.5, preferably a factor of at least 5, and most preferably a factor of at least 10, and may even be as high as a factor of about 50.

The exact magnitude of volume transition is dictated by the above thermodynamic factors and also the degree of crosslinking of the gel bead 10 network. A high crosslinking density hinders gel bead expansion because the network strands cannot be stretched beyond a certain tautness limit.

Slightly crosslinked gel beads 10 made of the same chemical repeat units can correspondingly expand a significant extent. The rate of expansion and contraction is mass-transfer controlled, and depends on the viscosity of the solvent 16, segment rigidity and flexibility of the crosslinked gel beads 10, temperature (which governs diffusivity), and average gel bead 10 dimension. Larger, more rigid gel beads 10 dispersed in viscous solvents 16 will respond slower than their counterparts. Well known chemical engineering and polymer physics principles can be relied upon to provide guidance in the design and synthesis of gel beads 10 and selection of solvents 16. See for example, S. H. Gehre, 109 and 110 ADVANCES IN POLYMER SCIENCE 81 (K. Dusek ed. Springer Verlag 1993).

Figure 3A:
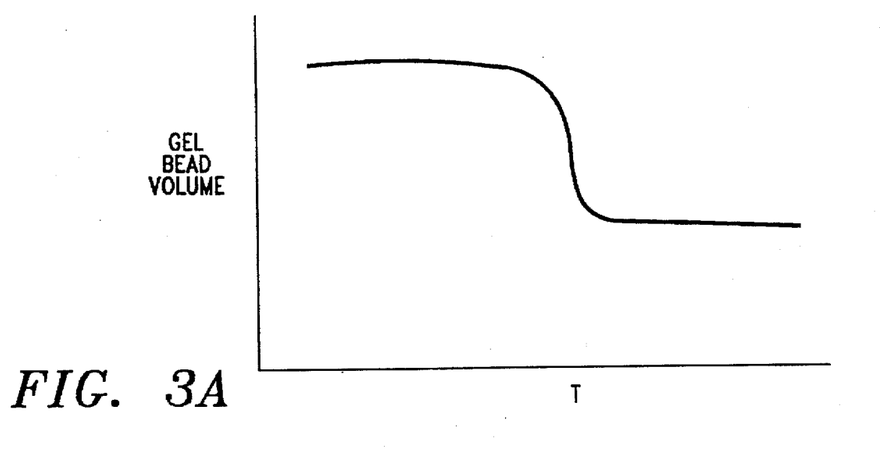
FIG. 3A is a typical volumetric response curve of a swellable and deswellable polymer used in this invention that reversibly contracts abruptly above a critical transition temperature.
Figure 3B:
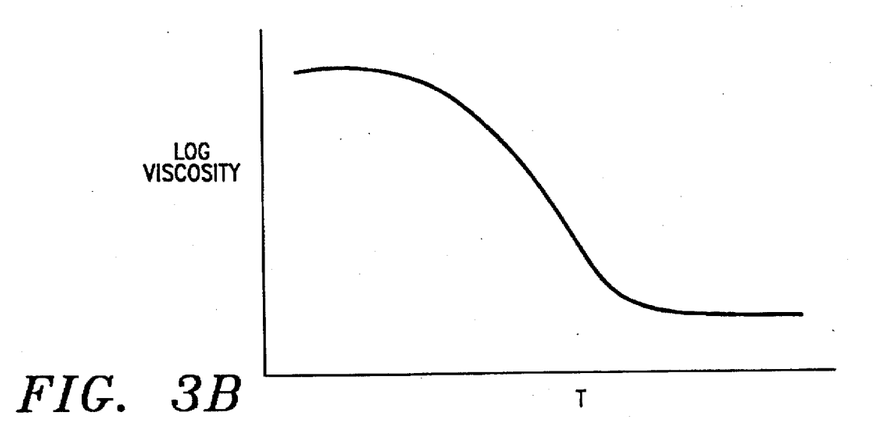
FIG. 3B is the corresponding reversible viscosity transition induced by gel contraction illustrated in 3A.
Figure 3C:
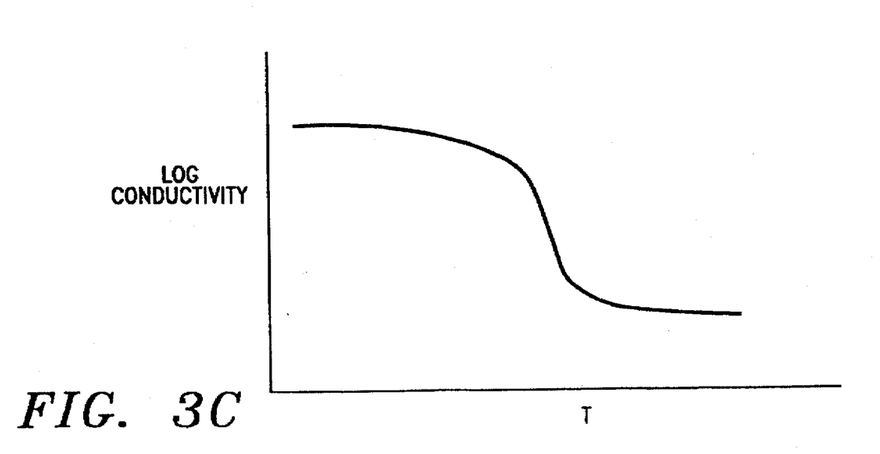
FIG. 3C is the reversible conductivity transition triggered by gel contraction leading to destruction of the percolation network of the conducting filler particles.

FIG. 3 shows that an order-of-magnitude change in gel bead 10/12 volume can trigger several orders-of-magnitude change in viscosity. The exact change is dictated by several factors, including the gel bead 10 loading level (i.e., volume fraction) and gel particle 10 size distribution. The concept of maximum packing volume fraction can be invoked to explain the drastic and nonlinear dependence of viscosity upon the total gel compound 14 content. As represented in FIG. 3A, when the gel beads 12 expand, their volume fraction suddenly increases. However, as illustrated in FIG. 3B, the system viscosity increases even more drastically, especially when the maximum packing volume fraction is approached. This phenomenon is well understood and explained in L. E. Nielson, 2 MECHANICAL PROPERTIES OF POLYMERS AND COMPOSITES ch. 7 (Marcel Dekker 1974). Since the expanded gel beads 12 are relatively soft and deformable, the individual beads assume polygonal shapes when forced against other expanding gel beads. As illustrated by the arrows 18 on either side of the composite article 14 of FIG. 2B, by tracing along the perimeters of the gel beads, one can traverse from one side of the sample to the opposite side without encountering discontinuities. Macroscopic distances can thus be spanned by microscopic contiguous pathways.

FIG. 3A shows a typical volumetric response of gel beads 10 contracting abruptly above a critical transition temperature. Here, the segment-solvent interaction is no longer favored above this transition temperature, generally referred to as the lower critical consolute temperature (i.e., temperature minimum above which polymer-solvent phase separation occurs). In FIG. 3B, the viscosity behavior of this system shows that as the gel beads 10 encounter one another in the expanded state 12, the system no longer flows easily, and the composite article 14 essentially becomes an elastic solid.

Solvents are selected from the group consisting of small molecules, oligomers, soluble polymers, and mixtures thereof that are compatible with the desired viscosity level and gel particle chemistry. It is standard practice in the art to use small molecules, providing a very liquid gel-solvent matrix.

According to the invention, oligomers and soluble polymers may also be used as solvents, therefore providing more control over the viscosity of the gel-solvent matrix. The exact composition of solvent employed is determined by the desired viscosity level and gel particle chemistry.

Table I gives a few examples to illustrate the tremendous variety of gel-solvent matrices 14 employable as the first two elements of this invention.

TABLE I

Selected Gel Formulations, Solvent and Transition Mechanisms

| Gel Ingredient List | Solvent Components | Switching Parameter |
|---|---|---|
| N-isopropyl acrylamide bis-acrylamide | water | temperature |
| N-isopropylacrylamide bis-acrylamide | water, acetone | acetone evaporation |
| polyethyleneglycol di-acrylate, hydroxyethylmethacrylate | ethylene glycol, water | temperature |
| polyethylene glycol di-acrylate hydroxyethylmethacrylate | ethylene glycol, water acetone | acetone evaporation |
| octyl/decyl acrylate, ethoxylated trimethylol propane triacrylate | toluene, methyl ethyl ketone (MEK) | temperature or MEK evaporation |
| sulfonated styrenes acrylated aromatic urethane oligomers | polyethylene glycol, glycerol | temperature |
| commercially available silicone gel formulations | silicone fluids (aromatic and aliphatic) | temperature |
| vinylsilicones silicone acrylates | silicone copolymers | temperature or volatile absorption/ desorption |

Figure 4A:
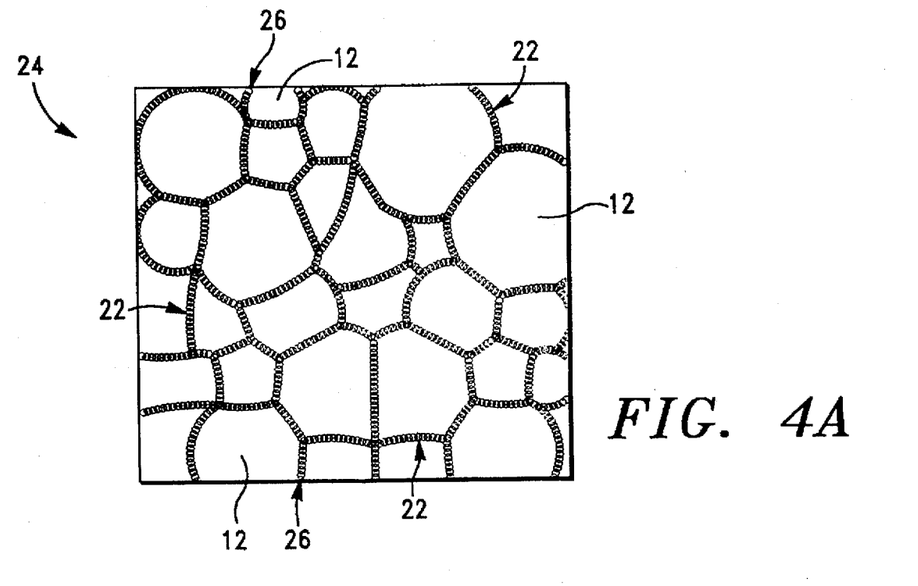
FIG. 4A shows swollen gel particles reversibly forming the percolation network.

Table 1 shows that the solvent 16 can be simply water, or it can be a combination of two or more solvents, such as polyethylene glycol and glycerol. Third elements of the composite articles according to the invention are conductive filler particles 22. As illustrated in FIG. 4A, conductive filler particles 22 are suspended in the gel-solvent matrix 14 of FIG. 2 making the composite article 24 of the present invention. According to the invention, the size, shape and total volume fraction of the conductive filler particles 22 are fixed in a particular composite article. High thermal and/or electrical conductivity filler particles 22 are well known in the literature. Examples are listed in Table II.

TABLE II

High Thermal and/or Electrical Conductivity Filler Materials.

| Material | Density g/cm$^3$ | Thermal conductivity W/m K | Specific electrical resistance micro ohm-cm |
|---|---|---|---|
| Diamond | 3.51 | 550–2000 | — |
| Silver | 10.5 | 427 | — |
| Copper | 8.9 | 398 | — |
| Aluminum | 2.7 | 240 | — |
| Silicon carbide | 3.22 | 42–270 | 107–200 ohm-cm |
| Aluminum nitride | 3.26 | 30–200 | >10$^{32}$ |
| Boron nitride | 2.25 | 10–60 | >10$^{14}$ |
| Silicon nitride | 3.44 | 12–32 | 10$^{20}$ |
| Alumina | 3.98 | 30 (at 100° C.) | 3 × 10$^{19}$ (at 300° C.) |
| Zinc oxide | 5.6 | 26 | 2 × 10$^{20}$ |
| Titania | 4.17 | 6.5 (at 100° C.) | 1.2 × 10$^{10}$ (at 800° C.) |

In addition to the conductive filler particles listed in Table II, colloidal carbon black may be employed in the intention. The state of flocculation and deflocculation and the microparticle morphology are important determinants of both the electrical and thermal conductivities of carbon-black-filled composites.

Aluminum oxide, may also be employed as a conductive filler particle 22. It is available in submicron sizes and can interact well with a wide range of dispersants due to the amphoteric nature of its surface.

Colloidal silver and other micron size range conductive filler particles can also be made to disperse uniformly in selective solvents.

According to the invention, conductive filler particles 22 comprise any shape, such as powder, bead, fiber, or flake. Conductive filler particles 22 can be metal or carbon coated, such as coated glass bubbles, coated glass beads, or coated mica flakes. Preferred metal coatings include silver, nickel, copper, gold, and tungsten. Such coatings can be continuous or discontinuous. When continuous coatings are present, their thicknesses can be more than zero and up to 10 micrometers or more. Additionally, a combination of two or more conductive filler particles 22 can be used in the invention. Coated particles density match with the solvent to discourage particle settling.

According to the invention, the size of the conductive filler particles 22 are within the range of about 0.001 micrometer to about 600 micrometers, preferably from 0.01 micrometer to 200 micrometers, and most preferably from 0.01 micrometer to 100 micrometers. Powder resistivity of the conductive filler particles 22 should be less than about 10 ohm-cm, preferably less than 1 ohm-cm, and most preferably less than $10^{-1}$ ohm-cm. Where metal powders are used, the powder resistivity can be as low as about $10^{-6}$ ohm-cm.

According to the invention, the shape of the conductive filler particles 22 can be regular or irregular. Where essentially isotropic conductivity is desired, spherical filler particles 22 are preferred. It is well known in the art that use of anisotropic conductive particles such as conductive flakes and fibers greatly increases xy, or inplane, conductivity in sheetlike articles. It is also reported in U.S. Pat. No. 5,328,756, that by incorporating conductive flakes, such as silver coated mica flakes, with conductive bubbles or beads, conductivity in the plane goes up significantly. When current is to flow in the plane of a sheetlike article 24 of the invention, it is desirable to incorporate anisotropic conductive particles 22 such as conductive flakes or fibers.

Examples of specific shapes of conductive filler particles 22 useful in the present invention include copper powder, 10 micrometer (Alfa Products, Ward Hill, Mass.); silver coated nickel flake, −200 mesh (Alfa Products); silver coated hollow glass bubbles, solid glass beads, and mica flake (Potter Industries, Inc., Parsippany, N.J.); and carbon powders (Aldrich Chemical Co., Milwaukee, Wis.).

A preferred volume fraction of conductive filler particles 22 to total weight of the composite article 24 of the invention is in the range from about 90% to about 0.1%, preferably from 80% to 1%, and more preferably from 65% to 5%.

If the conductive filler particles 22 are similarly charged or covered with polymeric "whiskers" or surfactants, suspension stability is enhanced. Alternatively, the conductive filler particles 22 may be chemically coupled to or electrostatically attracted to the gel beads 10 to further enhance suspension stability as well as ensure rapid conductivity switching when desired.

Figure 4B:
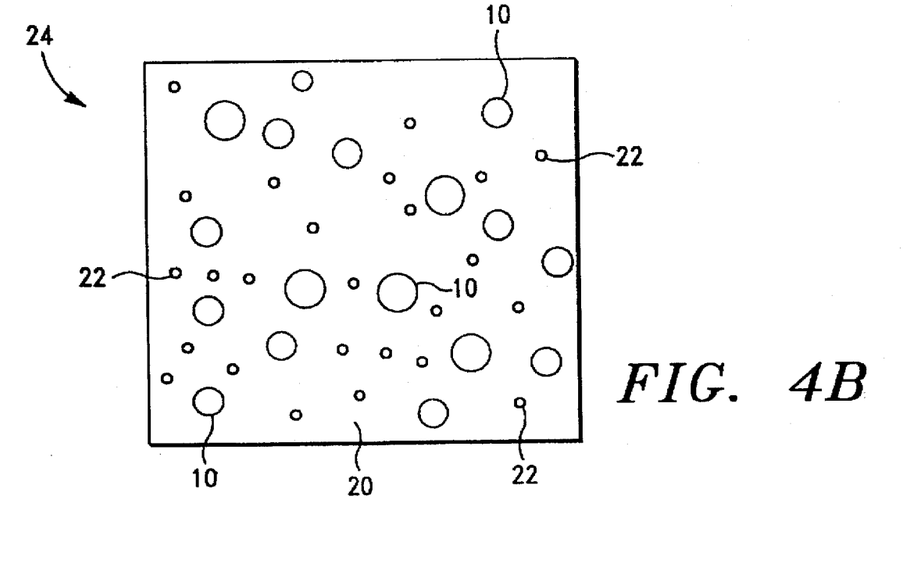
FIG. 4B shows contracted gel particles reversibly destroying the percolation network.

Fourth elements of the conductive composite article 24 of this invention are optionally included. These elements are additives to the gel-solvent matrix for enhancing suspension stability. Additionally the additives prevent conductive filler particle 22 coagulation when the gel particles 10 are in the contracted state. In FIG. 4, the solvent 16 of FIG. 2, may or may not be mixed with an additive, and is referred to as the solvent mix 20.

Methods to control the state of flocculation and deflocculation of polymeric particles and conductive filler particles in liquid matrices by way of additives, such as surface active dispersing agents are well known in the art. A large body of literature has been established describing these methods, for example, I. Sushumna, R. K. Gupta, and E. Ruckenstein,

*Stable, Highly Concentrated Suspensions for Electronic and Ceramic Materials Applications*, 6 J. MATER. RES. 5, 1082–1093 (May 1991).

Surface active suspending agents are available from a number of sources. Commercial dispersants, such as the "hypermens" from ICI America can be used to generate high loading pastes. A number of chemical companies offer surfactants that possess hydrophilic-hydrophobic heads and tails, such as, Union Carbide (Triton), SAF (ionic and nonionic detergents), Rhone-Poulenc (comprehensive list of surfactants and specialties), BASF Performance Chemicals and Tri Products Performance Additives for Coatings, Inks and Adhesives. These surface active agents can enhance the inherent dispersion stability. Generally, smaller conductive filler particles 22 (e.g., submicron to 10 micron size range) can be stably suspended in moderately viscous media.

Mixtures according to this invention incorporating surface acting suspending agents exhibit a high degree of suspension stability during storage and can be processed at relatively low viscosities, allowing ready application and re-work of these materials. The loading level of the conductive filler particles 22 can be adjusted according to the invention, so that the desired electrical and/or thermal conductivities can be achieved before and after transition.

Since the composites 24 of the invention are form-fitting to the surfaces to which they are applied, they can be injected into cavities whose dimensions are not smaller than the size of individual gel particles in the collapsed state.

When used as a topical application, the composites 24 of the invention can be laid down as a thin coating. Thickness of the composite article 24 of the invention can range from about 0.5 µm to about 1 cm, preferably from 1 µm to 0.1 cm.

Temperatures according to the invention needed for gel bead expansion and contraction steps to occur depend on the type of polymer comprising the swellable and deswellable polymeric particles 10, the solvent 16 and the suspending agent employed. For example, typical temperatures range from about 30° C. to about 300° C., preferably from 60° C. to 200° C., most preferably from 80° C. to 100° C. Higher contraction temperature of swellable and deswellable polymeric particles 10 correlates with increased current carrying capacity for a given composition and geometry.

Useful electrical current ranges according to the invention can vary widely, depending on the composition of the composite article 24 and the cross sectional area through which the flow of electrons must pass. For example, practical currents range from about 0.0001 ampere to 100 amperes, preferably from 0.001 ampere to 50 amperes, most preferably from 0.01 ampere to 20 amperes. The length of time required for a composite article of the present invention to interrupt a circuit is dependent on the heat generated due to the flow of electricity.

Optionally, according to the invention, other components or adjuvants can be added to the composite article 24 to impart some added functionality, such as color or strength, to the final composite article 24. When present, adjuvants can be included in an amount from about 0.01% to about 50% by weight, preferably from 0.1% to 40%, and most preferably from 0.5% to 25%, based on the total weight of the composite article 24. As with expandable polymeric particles 10, additional components can be swellable or non-swellable in aqueous or organic liquid, and preferably are substantially insoluble in water or organic liquids. In accordance with this invention, the additional components may be fibrous for enhancing the mechanical integrity of the article 24.

Optional adjuvants can be in the size range of from about 0.1 micrometer to about 600 micrometers, preferably from 0.5 micrometer to 200 micrometers, most preferably from 1 micrometer to 100 micrometers. This size range is desirable for obtaining preferred physical properties, such as toughness and uniformity of the resulting composite article 24.

It is important that the composite article 24 be cohesive enough to prevent leakage of the conductive filler particles 22, the swellable and deswellable polymeric particles 10/12 and solvent so that the final composite article 24 has sufficient structural integrity to be handled. In the present invention, the conductive filler particles 22 and the swellable and deswellable polymeric particles 10/12 do not easily dislodge from the final composite article 24. A further advantage of the composite article 24 is that the solvent mix 20 is drawn into the gel beads 10, leading to expansion of the gel beads 12, thereby maintaining the structural integrity of the composite article 24. In addition, the non-bonded nature of the solvent mix 20 to the swellable and deswellable polymeric particles 10/12 also allows the solvent mix 20 to be easily expelled from the expanded gel beads 12 during contraction. The useful range of solvent mix 20 in the final composite articles 24 can be from about 10% to about 90%, preferably from 20% to 80%, and most preferably from 30% to 70%, based on the total volume of the composite article 24.

Preferably, the composite articles 24 of the invention are thin and can be used as electrical or thermal circuit breaking elements, or environmentally sensitive detection systems.

The composite article 24 of the present invention exhibits a high degree of suspension stability at relatively low application viscosities, allowing ready processing and use of these composite materials 24. The loading level of conductive filler particles 22 can be adjusted so that the desired electrical and/or thermal conductivities can be achieved before and after transition of the gel beads 10. When thermally conducting but electrically non-conducting filler particles 22 are used, these systems 24 can provide great heat dissipation properties, making them useful as thermal grease materials.

According to the invention, the composite articles 24 can be formulated to undergo transitions that switch their electrical conductivity between that of an insulator and a conductor. Such switching behavior can be used for circuit surge protectors and self-regulating heating tapes, two of many practical examples of these mixtures.

The "switching" behavior of the invention is rendered feasible by well-known, and previously discussed, thermodynamic principles governing crosslinked networks dispersed in judiciously chosen solvent mix 20 systems. Certain thermodynamic parameters, such as temperature, pH, ionic strength and solvent mix 20 choice/composition, may trigger the swelling of collapsed crosslinked gel particles 10 or the collapse of swollen crosslinked gel particles 12. Since the interstitial fluid (the solvent mix 20) is either imbibed by the expanding gel beads 10 or extruded by the contracting gel beads 12, the volumetric fractions of the fluid and gel beads 10/12 can undergo drastic changes. When the gel beads 12 are swollen, the interstitial fluid occupies a negligible volume. When the gel beads 12 collapse, the interstitial fluid regains a large volume fraction, where the shaken gel particles 10 are discretely dispersed.

As the gel particles 10 expand, the interstitial solvent mix 20 volume decreases. The rigid conductive filler particles 22, which cannot be absorbed into the gel particles 10, are forced into intimate contact with one another. A percolation network is thus formed, where adjacent conductive filler particles 22 touch one another, creating electrical and/or thermal conducting pathways. The electrical and/or thermal conductivities thus greatly increase, sometimes by orders of magnitude.

Conductive filler particles 22 cannot be absorbed into the gel particles 10 because of steric limitations. The size of conductive filler particle 22 is greater than the mesh size of the gel beads 10. Therefore, swelling and deswelling involves only migration of solvent molecules into and out of the gel particles 10/12. The conductive filler particles 22 always reside in the interstitial fluid phase. Their degree of association changes in response to the swelling and deswelling state of the gel particles 10/12. The surface active suspending agent helps to keep these conductive filler particles 22 and the gel particles 10 when the conductive filler particles 22 are not chemically or electrostatically attached to the gel particles. In this manner, deflocculated conductive filler particle 22 association and dissociation can be reversible.

FIG. 4A illustrates the conductive filler particle 22 percolation pathways of the invention along a representative path designated by the two arrows labeled 26. It is the existence of these pathways 26 in a percolation network-type structure for a matrix where the gel beads 12 are in an expanded state that the system conductivity is elevated. When, as in FIG. 4B, the gel beads 10 are reversibly collapsed these pathways disintegrate and the system 24 conductivity diminishes as the percolation structure reverts back to a randomly dispersed conductive filler particle 22 state.

If thin films are formed by spreading the composite article 24 of the present invention on an inert substrate, they can be used as a detecting device to sense changes in temperature, pH, ionic strength, and solvent mix 20 composition (e.g., by absorption or desorption of volatiles). Many useful devices may emerge from this basic concept. Microfabricated structures can be created and used as disposable sensors. Circuit surge protectors and self-regulating heating elements can be made, where difficult geometrical layout is no longer a restriction.

This ease of adapting the present invention to many uses stems from the fact that this type of composite article 24 can be injected into, deposited atop, or smeared onto confined spaces, complex contours, or delicate structures in the low-viscosity dispersed staid and then made to solidify by gel bead 10 expansion.

Furthermore, if one desires, the composite article 24 of the invention may be extracted from such spaces, contoured surfaces or intricate elements by simply reverting it back into the low-viscosity state. Delicate high-powered integrated circuit chips can be mounted via such a novel "thermal grease" onto heat dissipating fins, and the composite article 24 is then "set" by gel bead 10 expansion. Yet, if re-work is desired, the expanded gel beads 12 are made to contract (by temperature, pH, ionic strength, and/or solvent mix 20 composition) and the chip easily lifted off from its anchor site.

The wide range of applications is only limited by our imagination.

As illustrated in the following examples, a variety of gel-solvent matrices (gel beads 10 plus solvent 16), conductive filler particles 22 and suspending agents give favorable results when producing the conductive composite article 24 based on expandable and contractible particulate matrices. However, the particular materials and amounts thereof recited in these examples, as well as other conditions and details, should not be construed to unduly limit this invention.

EXAMPLE 1

Thermal Conductivity Switching

If the suspending matrix (gel beads 10 plus solvent mix 20) has a thermal conductivity of 1 W/mK, while the thermally conducting filler particles 22 have a thermal conductivity of 100 W/mK, then the randomly dispersed and the percolating structure will exhibit greatly different conductivities. If the conductive filler particles 22 occupy 50% of the total system volume, then the composite article 24 will undergo a transition from about 2 W/mK to 50 W/mK between the two states. This calculation assumes additivity of heat transfer resistances for the dispersed state and additivity of conductivities for the percolating state.

Depending on the switching temperature and/or solvent mix 20 composition desired, the correct combination of temperature and composition is found by fixing one of the variables. If a gel compound switch responsive at 50° C. is desired, then at least two pure solvents are identified. One solvent fully swells the gel beads, while another causes complete collapse.

The suitable solvent mix 20 composition is then found by titration of one solvent into another, until the gel beads undergo a volume transition at 50° C. Alternatively, one may choose a fixed solvent mix 20 composition, and scan the temperature to see if a transition can be elicited. The chemistry of the gel bead 12 dictates the exact location and magnitude of transition.

Solution thermodynamics and theoretical modeling efforts have been reported in the literature, for example, in A. Sassi, POLYMER APPLICATIONS FOR BIOTECHNOLOGY, (D. Soane ed. Prentice Hall 1993).

EXAMPLE 2

Electrical Conductivity Switching

For most industrial applications elevated temperatures and non-volatile suspending matrices are desirable. Thermal grease and electrical conductivity switching can be made practical by choosing moderately viscous, inert, and non-volatile solvents, such as ethylene glycol, propylene glycol, glycerol, polyethylene glycol, polypropylene glycol, polyethylene-co-propylene glycol, petroleum grease, carbowax, paraffins, and silicone fluids (dimethylsiloxanes, methylphenyl siloxanes, siloxane-co-polyethylene glycol, siloxane-co-polypropylene glycol, siloxane-co-ethyleneprophylene glycol, and many more). The corresponding gel beads can be hydrocarbon-based or silicone-based. Many UV-curable and heat-curable monomers, oligomers, and crosslinkers are commercially available to fill the spectrum of gel bead formulations operative in hydrocarbons and silicones.

Commercial UV curable formulations are perhaps the easiest to formulate. Here, urethane acrylates, epoxy acrylates, glycol-substituted acrylates, alkane diacrylate homologs aliphatic polyether or polyester acrylates, aromatic polyether or polyester acrylates and analogs in methacrylates, silicone-substituted acrylates and methacrylates, are but a few examples. Mono-, bi-, tri- and multiple functionalities are readily available. The hydrophilicity and hydrophobicity of the resulting gel beads can be readily fine-tuned by copolymerization from two or more ingredients. Many gel bead formulations can be developed to suit transition specifications under a variety of conditions.

Note that electrical conductivities may differ by many orders of magnitude between the conductive filler particles and the suspending gel-solvent matrices. Therefore, the change in electrical conductivity for a given responsive composite article can be dramatic, making it useful as a switching device.

EXAMPLE 3

Aqueous-based Systems

Aqueous-based systems find most applications in biotechnology, bioseparations, and biosensors. Water-borne contaminant detection is another envisioned usage.

For example, composites are used as sensors by spreading a thin film on top of an interdigitated device (multiple electrodes). When the gel beads expand or contract, caused by the absorption and desorption of volatile, or changing temperature, the interdigitated electrodes detect the altered resistivity. When the gel particles are further modified by linkage with specific antibodies or enzymes, biological detectors can be made to respond to very specific analytes. Glucose sensors are thus made by incorporating glucose oxidase for changing the pH, leading to gel bead swelling and deswelling. This, in turn, triggers a change in electrical conductivity.

EXAMPLE 4

Self-regulating Heating Tape

The composite article of this invention can conduct electricity across the space between two parallel wires, creating heat. However, such a tape when crossed can generate hot spots. In the hot spots, the elevated temperature in localized, crossed regions causes collapse of gel beads, breaking the percolation network and reducing current passage. This eventually leads to lowered local heat generation. When the heat decreases, the gel beads expand, thus producing a self-regulating heating tape device.

While the foregoing detailed description has described several combinations of swellable and deswellable crosslinked polymeric particles, solvents, conductive filler particles and suspending agents for conductive gel composite articles based on expandable and contractible particulate matrices in accordance with this invention, it is to be understood that the above description is illustrative only and not limiting of the disclosed invention. Particularly included is a composite article in accordance with this invention that produces both thermally and electrically conductive gel compounds. These composite articles have unique conductive properties in that the contact between the composite article and the phenomenon source is intimate, leaving no air space between the intended surfaces and the compliant composite. The relative ease of application and removal in the low viscosity state, the exceptional composite stability against conductive filler particle settling, and the reversible and controllably dramatic transition in conductivity are all example attributes that cannot be readily achieved by current systems. It will be appreciated that various methods to produce various composite articles fall within the scope and spirit of this invention. Thus the invention is to be limited only by the claims as set forth below.

What is claimed is:

1. A composite article comprising:
   non-conductive polymeric particles, said polymeric particles being controllably expandable and contractible;
   a solvent for suspending said polymeric particles, said solvent forming a gel-solvent matrix with said polymeric particles, wherein said polymeric particles and said solvent interact to cause said polymeric particles to expand or contract in response to one or more changes in environmental conditions, at least some of said solvent being absorbed by said polymeric particles when said polymeric particles expand, said absorbed solvent being expelled from said polymeric particles when said polymeric particles contract; and
   conductive filler particles dispersed throughout said solvent, said conductive filler particles being too large to be absorbed by said polymeric particles
   wherein the conductivity of the composite article changes depending on whether the non-conductive polymeric particles are in an expanded or contracted state, with the conductivity of the composite article being greater when the non-conductive polymeric particles are expanded and the composite article being essentially non-conductive when the polymeric particles are contracted.

2. The composite article according to claim 1 further comprising a suspending agent for enhancing suspension stability of said conductive filler particles in said solvent.

3. The composite article according to claim 2 wherein said conductive filler particles are chemically coupled to said polymeric particles.

4. The composite article according to claim 2 wherein said conductive filler particles are electrostatically attracted to said polymeric particles.

5. The composite article according to claim 1 wherein
   when said polymeric particles expand, some of said solvent is absorbed into said polymeric particles, forcing said conductive filler particles into contact with each other, thereby forming a conductive network between and around said expanded polymeric particles
   whereby when said polymeric particles are expanded, said composite article is conductive and when said polymeric particles are contracted, conductivity of said composite article is reduced.

6. The composite article according to claim 1 wherein said several polymer segments form each of said polymeric particles; and
   thermodynamic parameters cause said polymeric particles to expand and contract, said thermodynamic parameters being selected from the group consisting of temperature, pH, light, pressure, electric field strength, ionic strength, solvent choice/composition, and hydrophilic/hydrophobic and polar-dipolar interactions between said polymer segments of said polymeric particles.

7. The composite article according to claim 1 wherein conductive filler particles are electrically conductive.

8. The composite article according to claim 1 wherein said conductive filler particles are thermally conductive.

9. The composite article according to claim 1 wherein said conductive filler particles are selected from the group: diamond, silver, copper, aluminum, silicon carbide, aluminum nitride, boron nitride, silicon nitride, alumina, zinc oxide, titania, colloidal carbon black, aluminum oxide and colloidal silver.

10. The composite article according to claim 9 wherein said conductive filler particles are powder, beads, fibers, flakes, bubbles, platelet, spherical, cubic, or irregularly shaped.

11. The composite article according to claim 10 wherein a combination of two or more of said conductive filler particles are used.

12. The composite article according to claim 1 wherein said conductive filler particles have a size in the range of about 0.001 to 600 micrometers.

13. The composite article according to claim 1 wherein said conductive filler particles are coated with carbon or metal.

14. The composite article according to claim 13 wherein said metal is selected from the group of silver, nickel, copper, gold and tungsten.

15. The composite article according to claim 1 wherein said polymeric particles are selected from the group:

N-isopropyl acrylamide and bis-acrylamide;

polyethylene glycol, di-acrylate and hydroxyethyl-methacrylate;

octyl/decyl acrylate and ethoxylated trimethylol propane triacrylate;

sulfonated styrene, acrylated aromatic and urethane oligomers;

commercially available silicone gel bead formulations; and vinylsilicones and silicone acrylate.

16. The composite article according to claim 1 wherein said contracted polymeric particles have a size in the range of about 0.05 to 1000 micrometers.

17. The composite article according to claim 1 wherein said expanded polymeric particles have a size in the range of about 0.1 to 1000 micrometers.

18. The composite article according to claim 1 wherein said suspending agent is selected from the group consisting of surfactants having hydrophilic-hydrophobic heads and tails.

19. The composite article according to claim 1 wherein said conductive composite article acts as an insulator by contracting under particular thermodynamic conditions thereby breaking contact between said composite article and an electric or heat source.

20. The composite article according to claim 1 wherein said conductive composite article is a heat sensor.

21. The composite article according to claim 1 wherein said conductive composite article is a chemical sensor.

22. The composite article according to claim 5 wherein said conductive composite article acts as a thermal switch by said polymeric particles expanding as a particular temperature, thereby forming said conductive network between and around said expanded polymeric particles; and said polymeric particles contracting at a different temperature, thereby not conducting heat when said conductive filler particles no longer are in contact with each other, thereby destroying said conductive network between and around said expanded polymeric particles.

23. The composite article according to claim 1 wherein said conductive composite article is a self-regulating heating tape.

24. The composite article according to claim 1 wherein said conductive composite article is an electrical switch.

25. The composite article according to claim 1 wherein said conductive composite article is a circuit surge protector.

26. A method of applying the composite article of claim 1 comprising the steps:

applying said composite article to a surface when said polymeric particles are contracted, said composite article having a lower viscosity and said conductive filler particles being dispersed within said solvent;

changing a thermodynamic parameter for causing said polymeric particles to expand;

whereby said polymeric particles expand, viscosity of said composite article increases, said conductive network of said conductive filler particles forms and said composite article becomes conductive.

27. The composite article according to claim 1 wherein said solvent is selected from the group consisting of small molecules, oligomers, soluble polymers, and mixtures thereof compatible with the desired viscosity level and gel particle chemistry.

* * * * *